United States Patent
Maeda et al.

[11] Patent Number: 6,110,598
[45] Date of Patent: Aug. 29, 2000

[54] LOW RESISTIVE TANTALUM THIN FILM STRUCTURE AND METHOD FOR FORMING THE SAME

[75] Inventors: Akitoshi Maeda, Tokyo; Hideo Murata, Tottori; Eiji Hirakawa, Shimane, all of Japan

[73] Assignees: NEC Corporation; Hitachi Metals, Ltd., both of Tokyo, Japan

[21] Appl. No.: 09/178,534

[22] Filed: Oct. 26, 1998

Related U.S. Application Data

[63] Continuation of application No. 08/657,595, May 31, 1996, abandoned.

[30] Foreign Application Priority Data

May 31, 1995 [JP] Japan ...................... 7-158411

[51] Int. Cl.[7] .................................................. B32B 9/00
[52] U.S. Cl. ........................ 428/457; 428/698; 428/700
[58] Field of Search .................................. 428/457, 469, 428/698, 700

[56] References Cited

U.S. PATENT DOCUMENTS

| | | |
|---|---|---|
| 3,663,408 | 5/1972 | Kumagai et al. . |
| 3,793,175 | 2/1974 | Joly et al. . |
| 4,364,099 | 12/1982 | Koyama et al. . |
| 5,221,449 | 6/1993 | Colgan et al. . |
| 5,281,554 | 1/1994 | Shimada et al. . |

*Primary Examiner*—Timothy M. Speer
*Attorney, Agent, or Firm*—Young & Thompson

[57] ABSTRACT

A method for forming a lamination structure of a tantalum nitride film and a tantalum thin film free of nitrogen overlying the tantalum nitride film, which have reduced resistivities, wherein a gas pressure during sputtering for growing the tantalum nitride film is limited to a predetermined value not more than about 0.5 pa so that the tantalum nitride film has a hexagonal crystal structure and the tantalum thin film free of nitrogen has a BCC structure with lattice spacing close to that of the tantalum nitride film hexagonal crystal structure.

7 Claims, 13 Drawing Sheets

LOW RESISTIVE TANTALUM THIN FILM STRUCTURE AND METHOD FOR FORMING THE SAME

CROSS-REFERENCE TO RELATED APPLICATIONS

This application is a continuation of application Ser. No. 08/657,595, filed May 31, 1996, now abandoned.

BACKGROUND OF THE INVENTION

The present invention relates to a tantalum thin film usable as interconnections and electrodes in liquid crystal displays and electronic devices, and more particularly to a low resistive tantalum thin film structure and a method for forming the same.

In recent years, tantalum Ta has been widely used for metal-insulator-metal devices acting as switching devices in active matrix liquid crystal displays, and for interconnections for driving thin film transistors or electrodes since tantalum has the following advantages. First, tantalum is anodizable and thus may be made by anodization into tantalum oxide ($Ta_2O_5$) which has an extremely excellent insulating property. Second, tantalum is sufficiently resistant to chemicals and corrosion. Third, tantalum is highly adjustable to manufacturing processes.

If tantalum is deposited by normal sputtering on an insulation substrate to form a tantalum film, then a resistivity of the tantalum film is relatively high, for example, in the range of 170 $\mu\Omega$cm to 200 $\mu\Omega$cm. If an impurity gas such as nitrogen is mixed in a discharge gas, then a resistivity of tantalum film is normally about 60 $\mu\Omega$cm.

Particularly when it is required to enlarge a screen of the liquid crystal display and improve a high definition, one of the most important issues is how to reduce the material for interconnections used for driving the liquid crystal display. In those circumstances, the requirement for further and possible reduction in resistivity of tantalum has been on the increase.

In prior art, it has been proposed to provide a lamination structure of a tantalum nitride thin film and a tantalum thin film formed on the tantalum nitride thin film. Such techniques are disclosed, for example, in the Japanese laid-open patent applications Nos. 3-293329, 5-48097 and 5-289091. The thickness and nitrogen content of the tantalum nitride thin film are important factors for obtaining a low resistivity tantalum thin film. In the Japanese Laid-open Patent Application No. 5-289091, it is disclosed that an electrode is provided on an insulating substrate, wherein the electrode comprises a lamination structure of a tantalum nitride film and a tantalum film of body centered cubic crystal structure overlying the tantalum nitride film. It is proper that the tantalum nitride film has a thickness in the range of from 10 angstroms to 1000 angstroms and the tantalum nitride film has a nitrogen concentration in the range of 7 atm to 13 atm % or 33 atm % or more so that a resistivity of the tantalum film overlying the tantalum nitride film is 25 $\mu\Omega$cm.

In the Japanese laid-open Patent Application No. 3-293329, the following is disclosed. The thickness of the tantalum nitride may be approximately 300 angstroms or less. Particularly if the conditions for sputtering are optimized, the thickness of the tantalum nitride film may be 50 angstroms or more. If a nitrogen concentration of the tantalum nitride film is 40% or more, then the resistivity of the tantalum thin film overlying the tantalum nitride film is 30 $\mu\Omega$cm. Since the nitrogen concentration depends on the sputtering apparatus and the sputtering conditions, the nitrogen concentration should not necessarily be limited to the above range.

In the Japanese laid-open Patent Application No. 5-48097, it is disclosed that if the thickness of the tantalum nitride film is in the range of several tens angstroms to a few hundred angstroms, then the resistivity of the tantalum thin film overlying the tantalum nitride film is approximately 20 $\mu\Omega$cm.

The Japanese laid-open Patent Application No. 5,48097 describes the reason why the resistivity of the tantalum thin film overlying the tantalum nitride film is reduced as follows. If the tantalum thin film is epitaxially grown on the tantalum nitride film having the body centered cubic crystal structure, the tantalum thin film also has $\alpha$-phase, for example, the body centered cubic crystal structure and further is free of any impurity.

In the Japanese Laid-open Patent Applications Nos. 3-52264 and 6-194677, it is disclosed that the tantalum nitride film and the tantalum thin film are laminated in order to improve adhesion to the substrate.

The Japanese Laid-open Patent Application No. 3-52264 describes as follows. In order to increase adhesion force of a tantalum electrode to an insulating substrate, the thickness of the tantalum nitride film is in the range of 100 angstroms to 2000 angstroms and the nitrogen concentration thereof is in the range of 0.5% to 10%.

On the other hand, the Japanese Laid-open Patent Application No. 6-194677 describes as follows. The nitrogen concentration of the tantalum nitride film is 10 atm % or more. The sputter powers for growing the tantalum nitride film and the tantalum thin film are limited to 4.0 W/cm$^2$ per a unit target area to suppress any raise of substrate temperature.

The Japanese Laid-open Patent Application Nos. 5-289091 and 6-194677 describe the methods for forming the tantalum nitride film, for example, sputtering by using a tantalum nitride alloyed target and reactive sputtering by using a mixed gas of argon and nitrogen. The above other applications also describe that the tantalum thin film overlying the tantalum nitride film may also be grown by sputtering, following to the growth of the tantalum nitride film by sputtering.

The Japanese Laid-open Patent Application No. 3-293329 further describes that the tantalum nitride film may be formed by subjecting the tantalum film to plasma nitration or thermal nitration in place of the sputtering.

Moreover, in the Japanese Laid-open Patent Application No. 59-55016, conventional methods for forming a refractory metal nitride film are disclosed as follows. A refractory metal is sputtered using a high frequency power onto a semiconductor substrate to form a metal nitride film which is useful as a barrier metal thereon. If the high frequency discharge is used for sputtering, a larger reduction in resistivity of the refractory metal nitride film can be obtained rather than when the dc discharge sputtering is used. The reduction in pressure of the sputtering gas can reduce the resistivity of the refractory metal nitride film. Preferable range of the sputtering gas pressure is in the range of 5 mTorr to 10 mTorr.

It was, however, confirmed by the inventors of the present application that if the tantalum nitride film is grown by the reactive sputtering, then it is difficult to obtain a sufficient reduction in resistivity of the tantalum thin film overlying the tantalum nitride film. It has been found that in order to obtain a further reduction in resistivity of the tantalum thin film it is insufficient to control the thickness and the nitrogen concentration of the tantalum nitride film in accordance with the conventional manner as described above.

The method for growing the tantalum nitride thin film by direct sputtering using the tantalum nitride alloyed target has problems in that it is difficult to make the target and to generate many particles. Further, nitrogen components in the target are volatilized during formation of the film, or the scattering effect of nitrogen elements is enlarged in case of the tantalum nitride alloy target. For those reasons, the nitrogen concentration during the growth of the film may vary depending upon the sputtering conditions and condition in use of the target whereby the resistivity of the tantalum film overlying the tantalum nitride film is unstable.

When the method for forming the tantalum nitride film by subjecting the tantalum thin film to a plasma nitration or by thermal nitration is used, then an increased number of process steps are required. When the thermal nitration is carried out, then the substrate receives thermal damage. Tantalum has the β-phase, for example, cubic lattice structure which provides a high resistivity. Even if such tantalum is subjected to the plasma nitration or the thermal nitration, the undesirable cubic lattice structure remains unchanged to still have a high resistivity. Namely, it is difficult to obtain a sufficient reduction in resistivity of the tantalum thin film overlying the tantalum nitride film.

In the above circumstances, it had been required, until the preset invention was made by the inventors, to provide a novel lamination structure of a tantalum nitride film and a tantalum thin film having a reduced resistivity, in addition to provide low resistive tantalum interconnections and low resistive tantalum electrodes.

SUMMARY OF THE INVENTION

Accordingly, it is an object of the present invention to provide a novel method of forming a lamination structure of a tantalum nitride film and a tantalum thin film having a reduced resistivity, which is free from the problems as described above.

It is a further object of the present invention to provide an interconnection comprising a novel lamination structure of a tantalum nitride film and a tantalum thin film having a reduced resistivity, which is free from the problems as described above.

It is a furthermore object of the present invention to provide an electrode comprising a novel lamination structure of a tantalum nitride film and a tantalum thin film having a reduced resistivity, which is free from the problems as described above.

The above and other objects, features and advantages of the present invention will be described from the following descriptions.

The present invention provides a method for forming a lamination structure of a tantalum nitride film and a tantalum thin film overlying the tantalum nitride film, which have reduced resistivities by sputtering, wherein a gas pressure in sputtering for growing the tantalum nitride film is limited to a predetermined value not more than about 0.5 pa.

The present invention provides a lamination structure of a tantalum nitride film and a tantalum thin film overlying the tantalum nitride film, which have reduced resistivities by sputtering, wherein a gas pressure in sputtering for growing the tantalum nitride film is limited to a predetermined value not more than about 0.5 pa.

The present invention provides a lamination structure of a tantalum nitride film and a tantalum thin film overlying the tantalum nitride film, wherein the tantalum nitride film has a hexagonal crystal structure.

BRIEF DESCRIPTIONS OF THE DRAWINGS

Preferred embodiments according to the present invention will be described in detail with reference to the accompanying drawings.

DISCLOSURE OF THE INVENTION

Figure 1A:
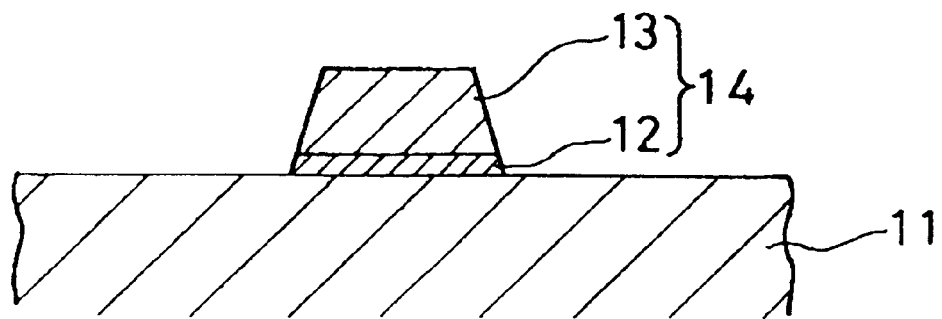
FIGS. 1A through 1C are fragmentary cross sectional elevation views illustrative of metal-insulator-metal device having a tantalum thin film in sequential steps involved in a fabrication method in a first embodiment according to the present invention.

The present invention provides a method for forming a lamination structure of a tantalum nitride film and a tantalum thin film overlying the tantalum nitride film, which have reduced resistivities by sputtering, wherein a gas pressure during sputtering for growing the tantalum nitride film is limited to a predetermined value not more than about 0.5 pa so that the tantalum nitride film has a hexagonal crystal structure.

It is preferable that the tantalum nitride film is grown by a reactive sputtering.

It is further preferable that a tantalum nitride film and a tantalum thin film are sequentially grown on an insulation substrate by reactive sputtering, wherein a gas pressure of the reactive sputtering is so controlled that the tantalum nitride film includes a hexagonal crystal structure and that a spacing of lattice planes of the hexagonal crystal structure of the tantalum nitride film is close to a spacing of lattice planes of a body centered cubic crystal structure of the tantalum thin film. For example, the spacing of lattice planes of the crystalline of hexagonal crystal structure of the tantalum nitride film is in the range of 2.3 Å to 2.6 Å.

The present invention also provides a lamination structure of a tantalum nitride film and a tantalum thin film overlying the tantalum nitride film, wherein the tantalum nitride film has a hexagonal crystal structure.

It is preferable that the tantalum nitride film includes a crystalline structure which comprises $TaN_x(x=1)$ and has a crystal orientation of (110) in X-ray diffraction.

It is also preferable that the tantalum nitride film includes a crystalline structure which comprises $TaN_x(x=0.8)$ and has a crystal orientation of (100) in X-ray diffraction.

It is also preferable that the tantalum nitride film includes a crystalline structure which comprises $TaN_x(x-0.5)$ and has a crystal orientation of (101) in X-ray diffraction.

It is also preferable that the tantalum nitride film includes a crystalline structure which comprises $TaN_x(x=0.43)$ and has a crystal orientation of (111) in X-ray diffraction.

It is also preferable that the tantalum nitride film includes at least two different crystalline structures selected from the group consisting of a first crystalline structure which comprises $TaN_x(x=1)$ and has a crystal orientation of (110) in X-ray diffraction, a second crystalline structure which comprises $TaN_x(x-0.8)$ and has a crystal orientation of (100) in X-ray diffraction, a third crystalline structure which comprises $TaN_x(x=0.5)$ and has a crystal orientation of (101) in X-ray diffraction, and a fourth crystalline structure which comprises $TaN_x(x=0.43)$ and has a crystalline orientation of (111) in X-ray diffraction.

According to the above described present invention, the tantalum nitride film and the tantalum thin film are sequentially grown on the insulating substrate, wherein a gas pressure during reactive sputtering for growing the tantalum nitride film is limited to a predetermined value not more than about 0.5 pa so that the tantalum nitride film includes a hexagonal crystal structure which is structurally stable. The spacing of lattice planes of the hexagonal crystal structure of the tantalum nitride film is close to the spacing of lattice planes of a body centered cubic crystal structure, providing a low resistivity, of the tantalum thin film. For example, the spacing of lattice planes of the crystalline of hexagonal crystal structure of the tantalum nitride film is in the range of 2.3 Å to 2.6 Å. Therefore, the tantalum thin film epitaxial grown on the tantalum nitride film has the body centered cubic crystal structure which provides a low resistivity. This means it is possible to form low resistivity tantalum nitride/tantalum film laminations which may be used for interconnections and electrodes.

The low resistivity tantalum nitride/tantalum film laminations according to the present invention may be applicable to switching device in liquid crystal displays so that a tantalum oxide film may be provided between electrodes, which has a uniform crystalline structure being almost free of crystal defects. This means that the tantalum oxide film has a high resistivity.

If the above described low resistivity tantalum nitride/tantalum film laminations are used as interconnections between electrodes for driving the liquid crystal display, there is almost no difference in transmission time of signals on the interconnections to thereby obtain a uniform and stable display. This leads to an improvement in quality or performance of elements of devices.

EMBODIMENTS

A first embodiment according to the present invention will be described in detail with reference to FIGS. 1A through 1C, wherein an improved tantalum nitride/tantalum film lamination structure is applied to a metal-insulation-metal device.

With reference to FIG. 1A, a tantalum nitride film 12 having a thickness of 300 angstroms is formed by reactive sputtering on a transparent insulating substrate 11 made of transparent insulating material such as synthetic resin. Subsequently, a tantalum film 13 having a thickness of 3000 angstroms is formed by normal sputtering on the tantalum nitride film 12.

Figure 8:
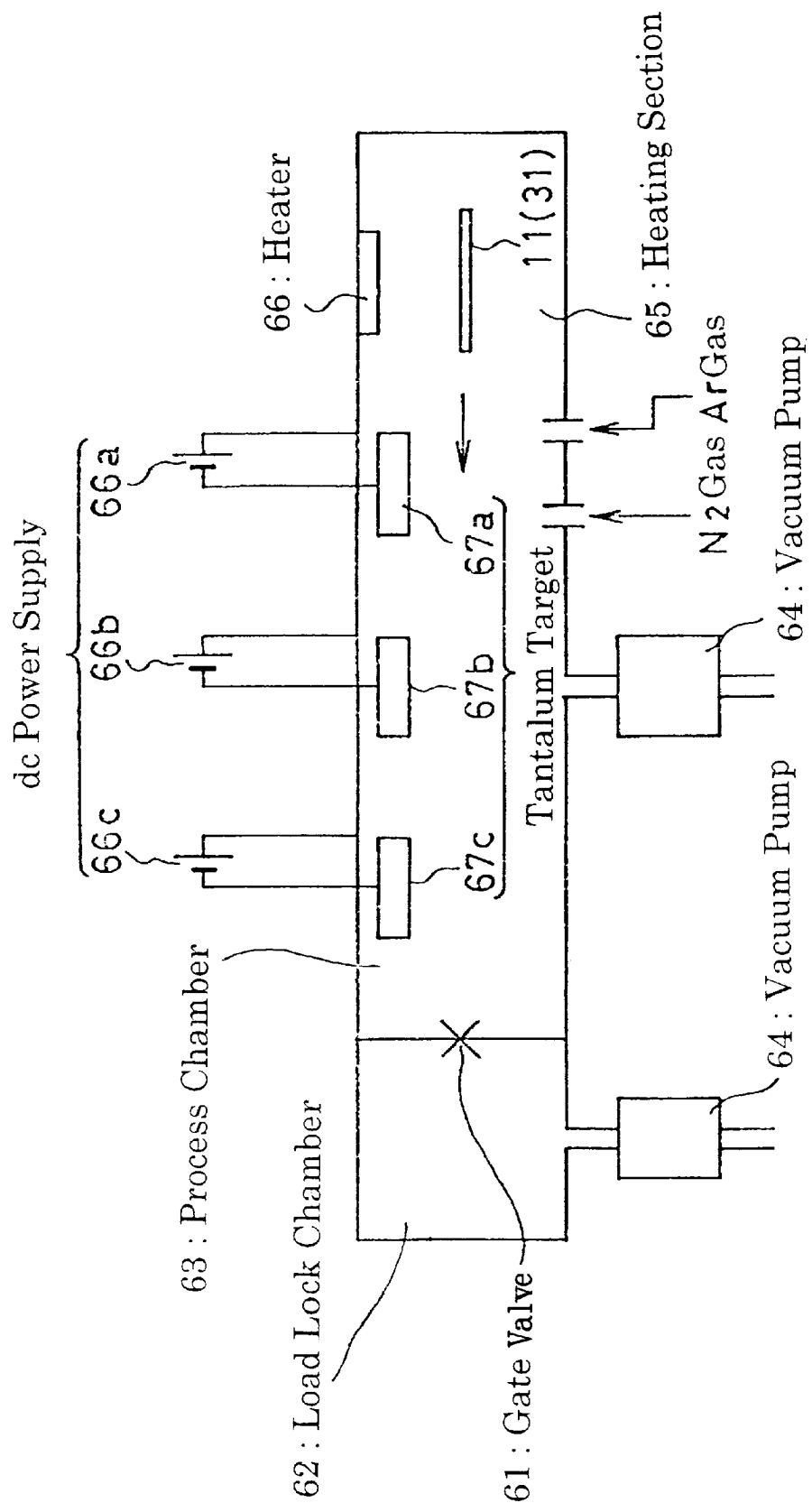
FIG. 8 is a view illustrative of a batch type sputtering apparatus to be used in embodiments described below in accordance with the present invention.

FIG. 8 illustrates a bath type sputtering apparatus which has a load lock chamber 62 and a process chamber 63 which are separated by a wall and connected to each other by a gate valve 61. The load lock chamber 62 and the process chamber 63 are provided with vacuum pumps 64 respectively to discharge gases from the load lock chamber 62 and the process chamber 63.

The degree of the process chamber 63 is set at $5\times10^{-4}$ pa or less before the gases is introduced into the process chamber 63. Three cathodes are provided and corresponding three tantalum targets 67a, 67b, 67c are also provided.

The substrate 11 in the load lock chamber 62 is carried into the process chamber 63 and then placed at a heat section 65 so that the structure 11 is heated up to about 100° C.

Argon gas and nitrogen gas are introduced into the process chamber 63 at the same flow rate, for example, 80 sccm. The flow rate for introduction of the argon gas and the nitrogen gas valves of the vacuum pumps 64 are adjusted so that the gas pressure of the process chamber 63 is limited to 0.5 pa or less.

The three cathodes are connected to three dc power supplies 66a, 66b, 66c respectively so that the three cathodes receive predetermined voltages from the three dc power supplies 66a, 66b, 66c and thus the three tantalum targets also receive the predetermined voltages from the three dc power supplies 66a, 66b, 66c.

The tantalum target 67 a is applied with a predeter mined voltage by the dc power supply 66a to cause electric discharges on the argon and nitrogen gases. As a result, on the surfaces of the tantalum target 67a the target surface is nitrated to generate ionized gas which cause tantalum nitride to be sputtered and adhered on the surface of the substrate 11 having been carried. In such manner, the tantalum nitride film having a thickness of 300 angstroms is formed on the insulating substrate 11 as illustrated in FIG. 1A.

The process gases, for example, argon gas and nitrogen gas are discharged from the process chamber 63. Thereafter, only the argon gas is introduced into the process chamber 63, wherein the flow rate is controlled so that the gas pressure is set at about 0.5 pa. In the meantime, the substrate 11 is placed at an intermediate position between the targets 66a and 66b.

The tantalum targets 66b and 66c are applied with predetermined voltages and at the same time a discharge is caused on the argon gas whereby the argon gas is ionized. As a result, tantalum on the tantalum target is sputtered by the ionized argon gas and then adhered on the surface of the substrate 11. It is available that the formation of the tantalum film is made by two sputtering steps using the tantalum targets 66b and 66c. As a result, a tantalum film 13 having a thickness of 3000 angstroms is formed on the tantalum nitride film 12.

The fact that the gas pressure in sputtering for formation of the tantalum nitride film 12 is set at 0.5 pa or less results in that the spacing of lattice planes of the hexagonal crystal structure of the tantalum nitride film is close to the spacing of lattice planes of the body centered cubic crystal structure, whereby the tantalum film epitaxially grown on the tantalum nitride film has the body centered cubic crystal structure which provides a low resistivity. As a result, the low resistivity tantalum thin film 13 is formed on the tantalum nitride film 12, and thus laminations of the tantalum thin film 13 and the tantalum nitride film 12 have a low resistivity.

Figure 9:
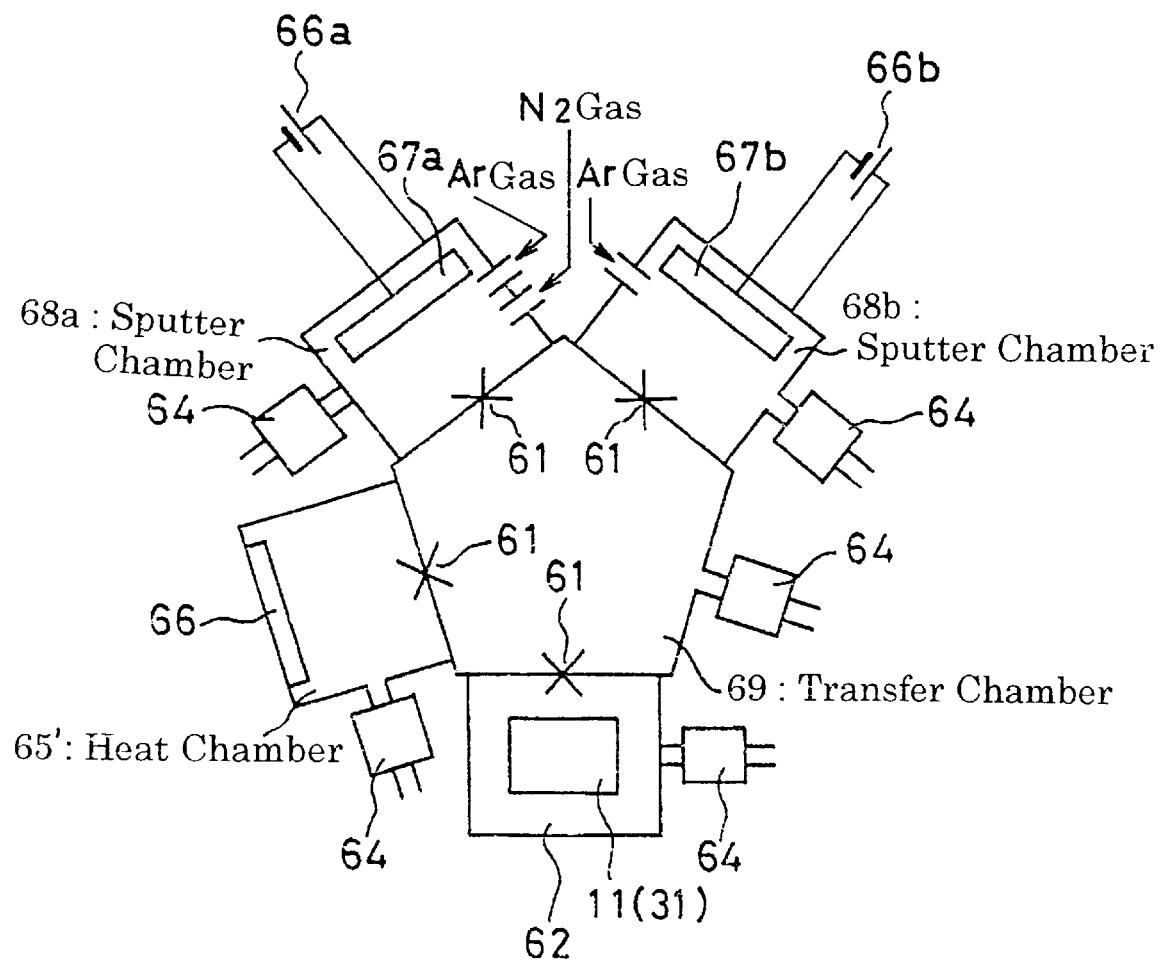
FIG. 9 is a view illustrative of a single wafer type sputtering apparatus to be used in embodiments described in accordance with the present invention.

In place of the above batch type sputtering apparatus as illustrated in FIG. 8, a single wafer sputtering apparatus as illustrated in FIG. 9 is also available. The single wafer sputtering apparatus has a transfer chamber 69 at a center position, which has a pentagonal shape defined by five side walls. A first side wall of the transfer chamber 69 is provided with a vacuum pump 64 for having process gas discharge from the transfer chamber 69. A second side wall of the transfer chamber 69 is provided with a load lock chamber 62 which is further provided with a vacuum pump 64 for having process gas discharge from the load lock chamber 62. A third side wall of the transfer chamber 69 is provided with a heat chamber 65 which is further provided both with a heater 66 for heating the substrate 11 and with a vacuum pump 64 for having process gas discharge from the load lock chamber 62. A fourth side wall of the transfer chamber 69 is provided with a first sputter chamber 68 a which is further provided with a cathode, a tantalum target 67a and a voltage supply 66a for supplying a predetermined voltage to the tantalum target 67a. The first sputter chamber 69a is further provided with a vacuum pump 64 for having process gas discharge from the first sputter chamber 68a. The first sputter chamber 68a is furthermore provided with an argon gas introduction port and a nitrogen gas introduction port. A fifth side wall of the transfer chamber 69 is provided with a second sputter chamber 68b which is further provided with a cathode, a tantalum target 67b and a voltage supply 66b for supplying a predetermined voltage to the tantalum target 67b. The second sputter chamber 68b is further provided with a vacuum pump 64 for having process gas discharge from the second sputter chamber 68b. The second sputter chamber 68a is furthermore provided with an argon gas introduction port. The heat chamber 65, and the first and second sputter chambers 68a and 68b are vacuumed at $1 \times 10^{-4}$ pa or less. The transfer chamber 69 is connected through gate valve 66 to the load lock chamber 62, the heat chamber 5 and the first and second sputter chambers 68a and 68b.

The substrate 11 is carried from the load lock chamber 62 through the transfer chamber 69 to the heat chamber 65 where the substrate 11 is heated up to about 100° C.

The substrate 11 is then carried through the transfer chamber 69 to the first sputter chamber 68a having already been introduced with the argon gas and the nitrogen gas. The flow rates of the introducing argon and nitrogen gases and a valve position of the vacuum pump are so adjusted that the nitrogen concentration is 12.5%, for example, the flow rates of argon gas and nitrogen gas are set at 160 sccm and 20 sccm, and the gas pressure is set at 0.5 pa or less.

The dc voltage supply 66a applies the predetermined voltage to the tantalum target 67a so that discharges are caused on the argon gas and the nitrogen gas for a predetermined time to thereby form a tantalum nitride film having a thickness of 300 angstroms on the substrate 11 as illustrated in FIG. 1.

The substrate 11 is then carried through the transfer chamber 69 to the second sputter chamber 68b having also been introduced but only with the argon gas.

The dc voltage supply 66b applies the predetermined voltage to the tantalum target 67b so that discharge is caused on the argon gas for a predetermined time to thereby form a tantalum film having a thickness of 3000 angstroms on the substrate 11 as illustrated in FIG. 1.

As a modification, if it is required to place a target other than a tantalum target in the second sputter chamber 68b, it is possible to form the laminations of the tantalum nitride film and the tantalum film overlying the tantalum nitride film by using only the tantalum target 67a in the first sputter chamber 68a as follows.

The substrate 11 is carried through the transfer chamber 69 to the first sputter chamber 68a having already been introduced with the argon gas and the nitrogen gas. The flow rates of the introducing argon and nitrogen gases and a valve position of the vacuum pump are so adjusted that the nitrogen concentration is 12.5%, for example, the flow rates of argon gas and nitrogen gas are set at 160 sccm, and the gas pressure is set at 0.5 pa or less.

The dc voltage supply 66a applies the predetermined voltage to the tantalum target 67a so that discharges are caused on the argon gas and the nitrogen gas for a predetermined time to thereby form a tantalum nitride film having a thickness of 300 angstroms on the substrate 11 as illustrated in FIG. 1.

The substrate 11 is then carried to the transfer chamber 69. In the meantime, the load lock chamber 62 is kept in vacuum.

The process gases are discharged from the first sputter chamber 68a before only the argon gas is introduced into the first sputter chamber 68a. The dc voltage supply 66a applies the predetermined voltage to the tantalum target to conduct a cleaning of the nitrated surface of the tantalum target 67a by dummy sputtering.

The substrate 11 is again carried into the heat chamber 65 to be heated up to about 100° C. and then carried to the first sputter chamber 68a.

The dc voltage supply 66a applies the predetermined voltage to the tantalum target 67a so that discharge is caused on the argon gas for a predetermined time to thereby form a tantalum film having a thickness of 3000 angstroms on the tantalum nitride film on the substrate 11 as illustrated in FIG. 1.

The fact that in sputtering the tantalum nitride film, the gas pressure is set at 0.5 pa or less results in formation of the low resistivity tantalum film overlying the tantalum nitride film. The reason why the tantalum film has a low resistivity is in the fact that the low gas pressure at 0.5 pa or less causes the tantalum nitride film having the spacing of lattice planes near to the spacing of lattice planes of the body centered cubic crystal structure, preferably in the range of 2.3 Å to 2.6 Å, whereby the tantalum film having the body centered cubic crystal structure providing the low resistivity is epitaxially grown on the tantalum nitride film. For those reasons, the laminations of the tantalum nitride film and the tantalum film also have a low resistivity.

Whereas in the descriptions, the dc voltage supply is used, a high frequency sputtering by use of a high frequency power supply is also available, in which case the tantalum film overlying the tantalum nitride film has a lower resistivity. This further reduces the resistivity of the laminations of the tantalum nitride film and the tantalum film.

There was experimentally confirmed the fact that if the thickness of the tantalum nitride film is 300 angstroms or more and the nitrogen concentration is at about 5 atm % or more, then the resistivity of the tantalum film epitaxially grown on the tantalum film is in the range of about 20 to 30 μΩcm.

As described above, the low resistivity tantalum/nitride film laminations are formed on the substrate.

With reference back to FIG. 1A, the tantalum nitride film and the tantalum film are patterned to form an interconnection 14 for signal transmission, which comprises the laminations of the tantalum nitride film and the tantalum film.

Figure 1B:
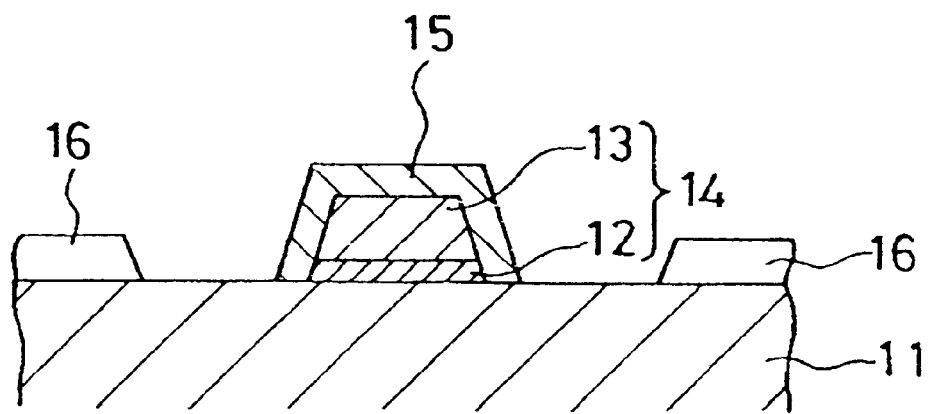

With reference to FIG. 1B, a surface of the interconnection 14 is subjected to an anodic oxidation to form a tantalum oxide film 15 being made of $Ta_2O_5$ on the surface thereof. The tantalum oxide film 15 has a thickness of 1000 angstroms whereby the thickness of the interconnection 14 is reduced to about 2500 angstroms.

A transparent conductive film made of a transparent and conductive material such as indium tin oxide is formed to extend on an entire surface of the substrate 11. The transparent conductive film has a thickness of 800 angstroms. The transparent conductive film is then patterned by a photo-lithography to thereby form pixel electrodes 16. The tantalum oxide film 15 acts as an insulator which provides a sufficient insulation performance.

Figure 1C:
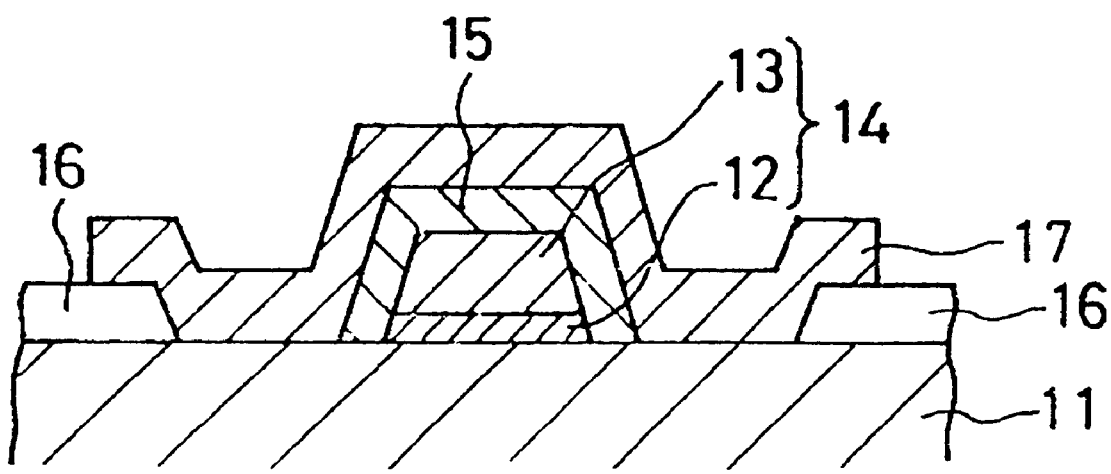

With reference to FIG. 1C, a titanium film 17 having a thickness of 1500 angstroms is formed on an entire surface of the substrate 11 and then patterned to thereby form a top electrode 17.

The metal-insulator-metal device formed in the manner as described above is available as a switching device for the liquid crystal displays so that there is no difference in signal transmission time between at opposite ends of signal transmission interconnection electrodes whereby a uniform display is obtained.

A second embodiment according to the present invention will be described with reference to FIGS. 2A–2B and 3A–3B, wherein a thin film transistor having low resistivity laminations of a tantalum nitride film and a tantalum film overlying the tantalum nitride film.

Figure 2A:
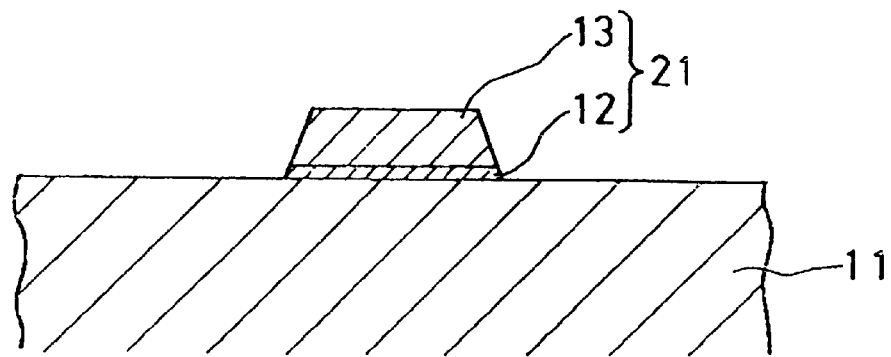
FIGS. 2A–2B and 3A–3B are fragmentary cross sectional elevation views illustrative of thin film transistors having a tantalum thin film in sequential steps involved in a fabrication method in a second embodiment according to the present invention.

With reference to FIG. 2A, a tantalum nitride film 12 having a thickness of 300 angstroms is formed on a transparent insulative substrate 11 made of a transparent insulating material such as glass by a reactive sputtering before a tantalum film 13 having a thickness of 3000 angstroms is formed on the tantalum nitride film 12 by normal sputtering. The sputtering conditions are the same as in the first embodiment except for heating the substrate 11 up to a substrate temperature of about 200° C. prior to the sputtering process.

The tantalum nitride film 12 and the tantalum film 13 are patterned by a photo-lithography to form a gate electrode 21 which comprises the lamination of the tantalum nitride film 12 and the tantalum film 13.

A surface of the gate electrode 21 is subjected to an anodic oxidation to form a tantalum oxide film 15 having a thickness of 100 angstroms whereby the thickness of the gate electrode 21 is reduced to about 2500 angstroms. The tantalum oxide film 15 will act as a first gate insulating film.

Figure 2B:
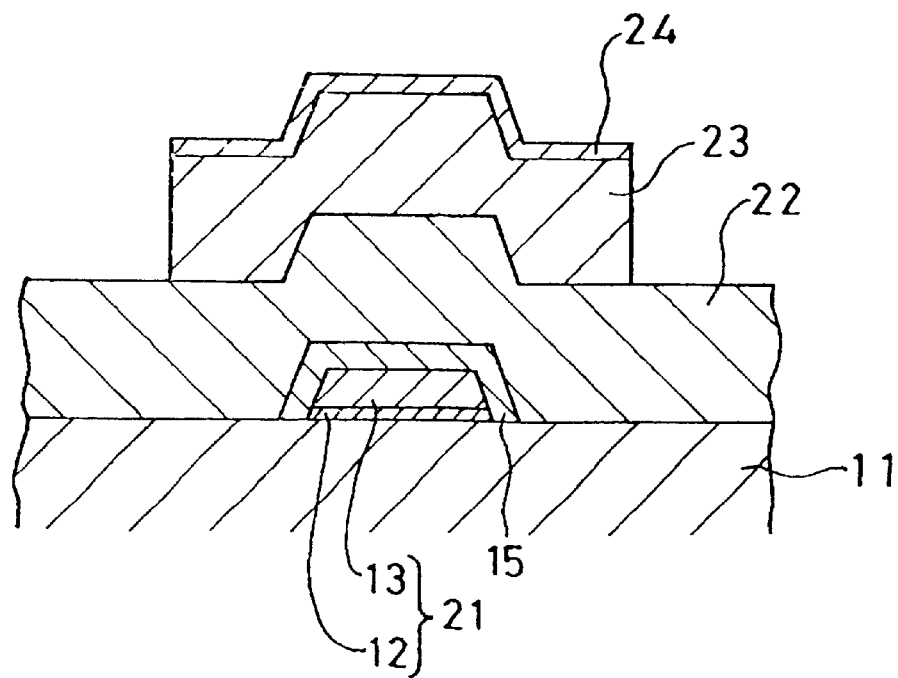

With reference to FIG. 2B, a silicon nitride film 22 having a thickness of 3000 angstroms is then deposited on an entire surface of the substrate 11 by a plasma chemical vapor deposition. The silicon nitride film 22 will act as a second gate insulating film. Subsequently, an intrinsic semiconductor layer 23 having a thickens of 2700 angstroms is formed on the silicon nitride film 22. An n-type semiconductor layer being doped with phosphorus and having a thickness of 300 angstroms is formed on the intrinsic semiconductor layer 23. The intrinsic semiconductor layer 23 and the n-type semiconductor layer. 24 are patterned.

Figure 3A:
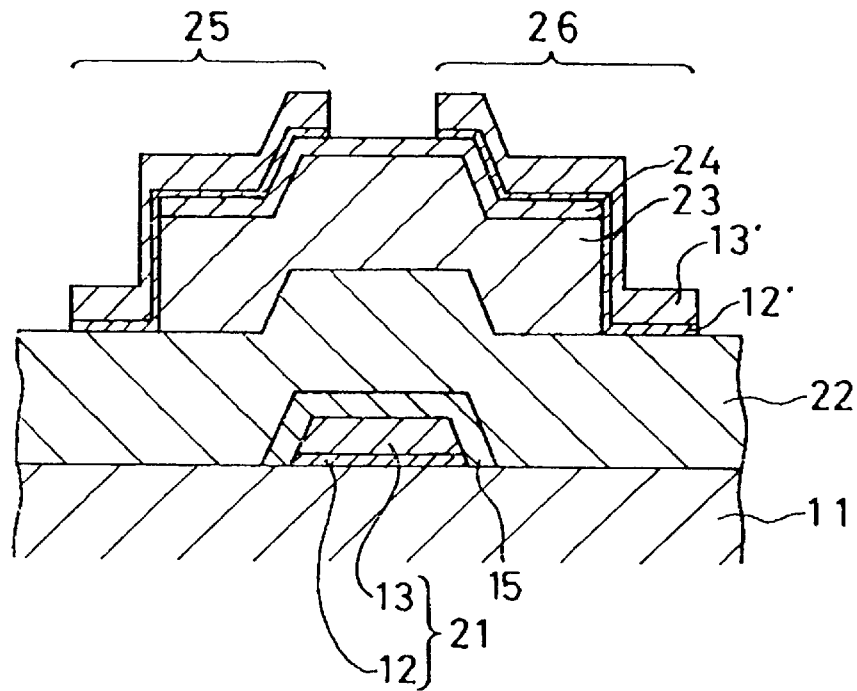

With reference to FIG. 3A, a tantalum nitride film 12 having a thickness of 300 angstroms is deposited on an entire surface of the substrate by a reactive sputtering. A tantalum film 13 having a thickness of 1500 angstroms is further deposited on the tantalum nitride film 12.

The conditions for sputtering are the same as in the first embodiment except for heating the substrate up to about 200° C.

The tantalum nitride film 12 and the tantalum film 13 are then patterned to form a source electrode 25 and a drain electrode 26, each of which comprises low resistivity laminations of the tantalum nitride film 12 and the tantalum film 13.

Figure 3B:
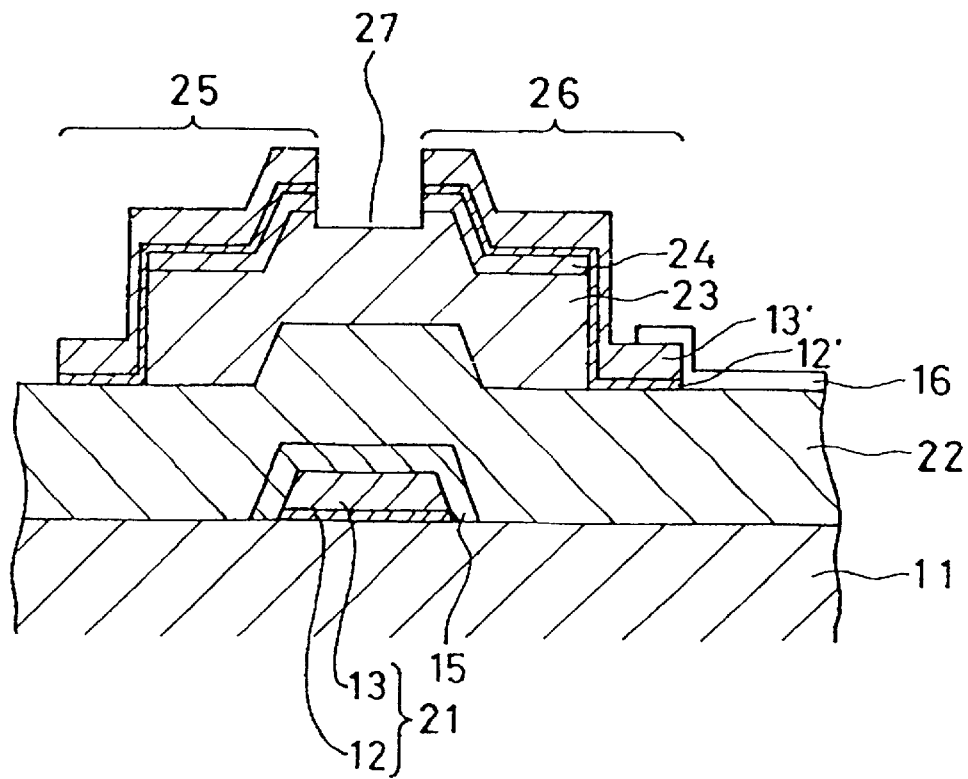

With reference to FIG. 3B, a transparent conductive film such as indium tin oxide film is formed on an entire surface of the substrate. The transparent conductive film has a thickness of 500 angstroms. The transparent conductive film is then patterned by a photo-lithography to form pixel electrodes 16.

The n-type semiconductor layer 23 is selectively etched by using the source and drain electrodes 25 and 26a s masks to form a recess in the upper region of the n-type semiconductor layer 23. The recess will act as a channel region 27.

The above described thin film transistor is useful as a switching device in the liquid crystal display. The gate line comprises the low resistive lamination structure of the tantalum nitride film and the tantalum film overlying the tantalum nitride film. This results in almost no difference in signal transmission time whereby a uniform display can be obtained.

A third embodiment according to the present invention will be described with reference to FIG. 4, wherein a capacitor having a low resistive tantalum film is provided.

Figure 4:
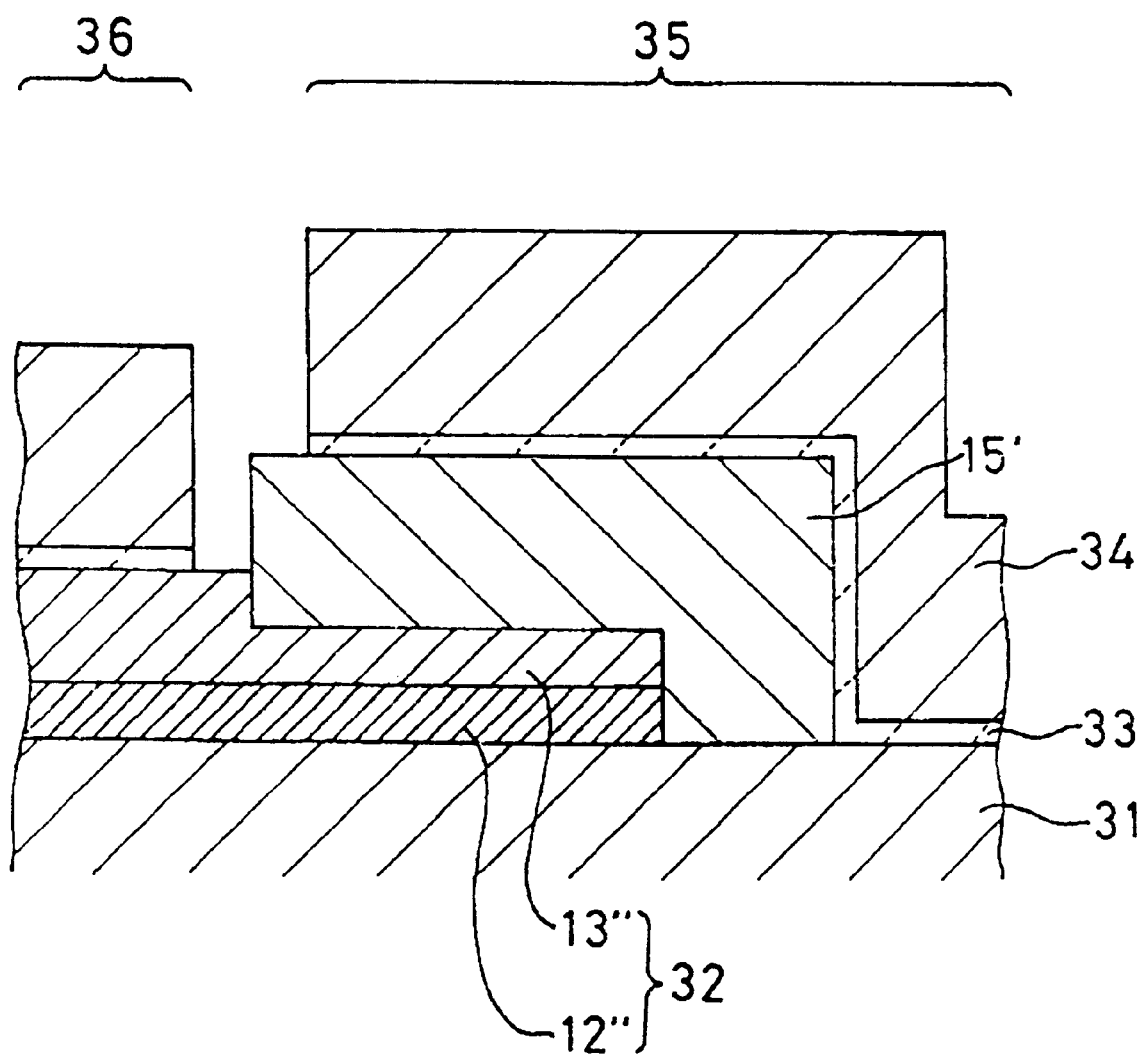
FIG. 4 is a fragmentary cross sectional elevation view illustrative of a capacitor having a tantalum thin film in a third embodiment according to the present invention.

With reference to FIG. 4, a tantalum nitride film 12 having a thickness of 1000 angstroms is deposited on an alumina substrate 31 by a reactive sputtering. Subsequently, a tantalum film 13 having a thickness of 2000 angstroms is formed on the tantalum nitride film 12 by normal sputtering. The conditions for sputtering are the same as in the first embodiment.

The tantalum nitride film 12 and the tantalum film 13 are then patterned to form a bottom electrode which comprises the laminations of the tantalum nitride film 12 and the tantalum film 13. A selective film part of the upper region of the tantalum film 13 is subjected to an anodic oxidation to form a tantalum oxide film 15 having a thickness of 5000 angstroms.

A nickel-chromium alloyed film 33 having a thickness of 200 angstroms is formed on the tantalum oxide film 15 by sputtering and then patterned by a photo-lithography to selectively leave nickel-chromium alloyed films 33.

A gold layer 34 having a thickness of 4000 angstroms is formed by plating and subsequently photo-lithography to form the gold layer 34 on the nickel-chromium alloyed film 33 whereby a top electrode 35 and a bottom electrode plug layer 37 are formed, each of which comprises the laminations of the nickel-chromium alloyed film 33 and the gold layer 34.

As described above, the dielectric film of the capacitor comprises the tantalum oxide film prepared by the anodic oxidation from the low resistive tantalum film whereby the tantalum oxide film having the body centered cubic crystalline free of crystal defect is epitaxially and uniformly grown. Such tantalum oxide film can suppress the leakage of currents. As a result, the capacitor has a high withstand voltage property.

The following descriptions will focus on the experimental results to explain the effect of the present invention.

Figure 5A:
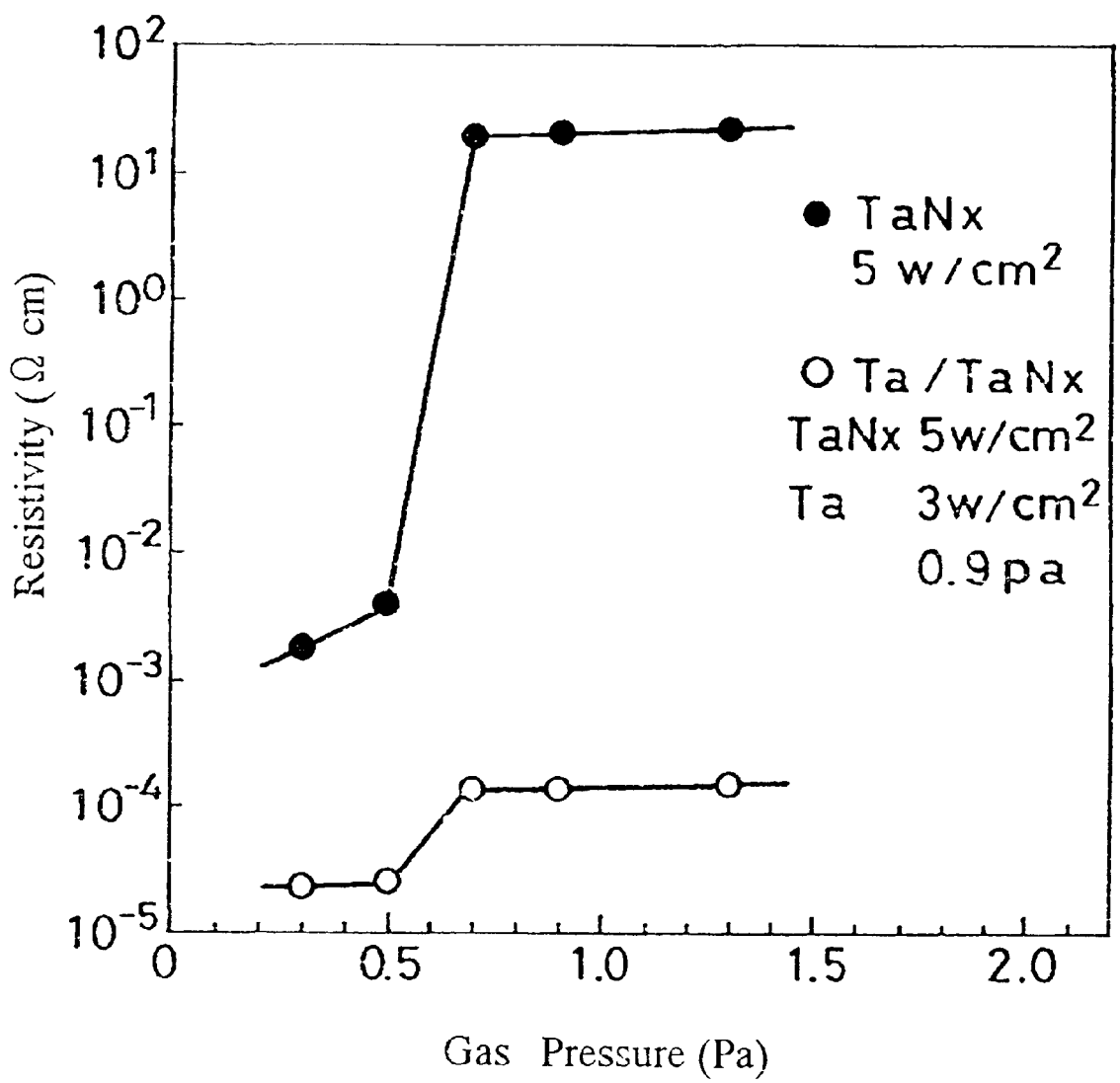
FIG. 5A is a diagram illustrative of variations in resistivities of a tantalum nitride film represented by "●" and a tantalum thin film represented by "○" over gas pressure during sputtering for forming a lamination structure of the tantalum nitride film and the tantalum film overlying the tantalum nitride film.
Figure 5B:
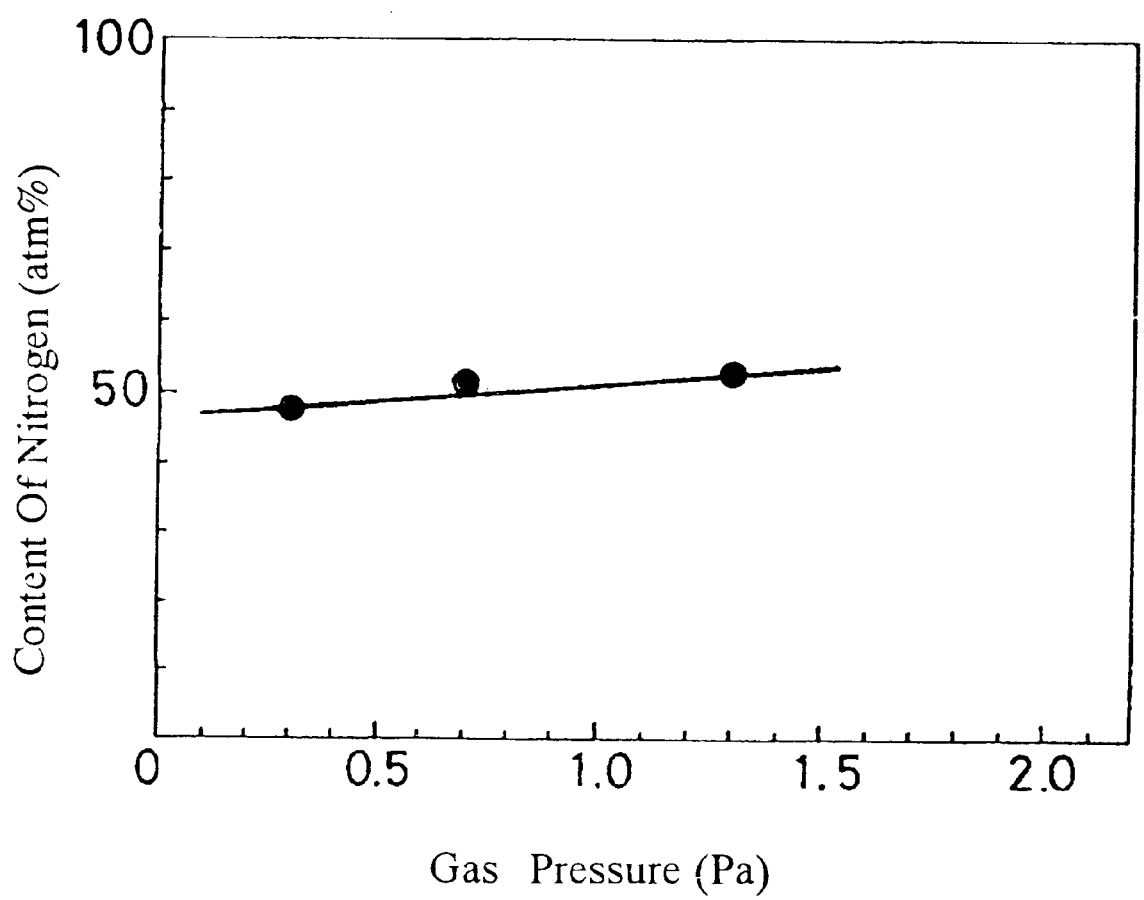
FIG. 5B is a diagram illustrative of variations in nitrogen content of a tantalum nitride film represented by "●" over gas pressure.

FIG. 5A illustrates variations in resistivities of a single tantalum nitride film and laminations of a tantalum nitride film and a tantalum film overlying the tantalum nitride film over gas pressures in sputtering for forming the tantalum nitride film. FIG. 5B illustrates variations in nitrogen concentration of a tantalum nitride film over gas pressures in sputtering for forming the tantalum nitride film. For sputtering, the flow rates of the argon gas and the nitrogen gas are the same as each other and a reactive sputtering is carried out by use of dc power supply.

The single tantalum nitride film has a thickness of 4000 angstroms whilst the tantalum nitride film and the tantalum film laminated have a thickness of 300 angstroms and a thickness of 3000 angstroms respectively. The conditions for sputtering for forming the tantalum film are uniform.

From FIG. 5, it can be understood that the nitrogen concentration of the tantalum nitride film remains almost unchanged at about 50 atm % over gas pressures. The resistivity of the tantalum film largely varies depending on the gas pressures. If the gas pressure is not more than 0.5 pa, then the resistivity of the tantalum film overlying the tantalum nitride film is in the range of 25 $\mu\Omega$cm to 30 $\mu\Omega$cm. By contrast, if the gas pressure is not less than 0.7 pa, then the resistivity of the tantalum film overlying the tantalum nitride film is in the range of 130 $\mu\Omega$cm to 150 $\mu\Omega$cm, which is near to that of the single tantalum nitride film.

The resistivities of the tantalum nitride film and the tantalum film are risen rapidly and slightly by increase in pressure of the process gas. The rapid increase in resistivity of the tantalum nitride film by increase in pressure of the process gas is caused by change from crystal line to amorphous due to the increase in pressure of the process gas. By contrast, the slight increase in resistivity of the tantalum film is caused by decrease in size of crystal grains due to the increase in pressure of the process gas, where increase in size of the crystal grains prevents oxygen in atmosphere from being captured into the crystal grains.

Figure 6A:
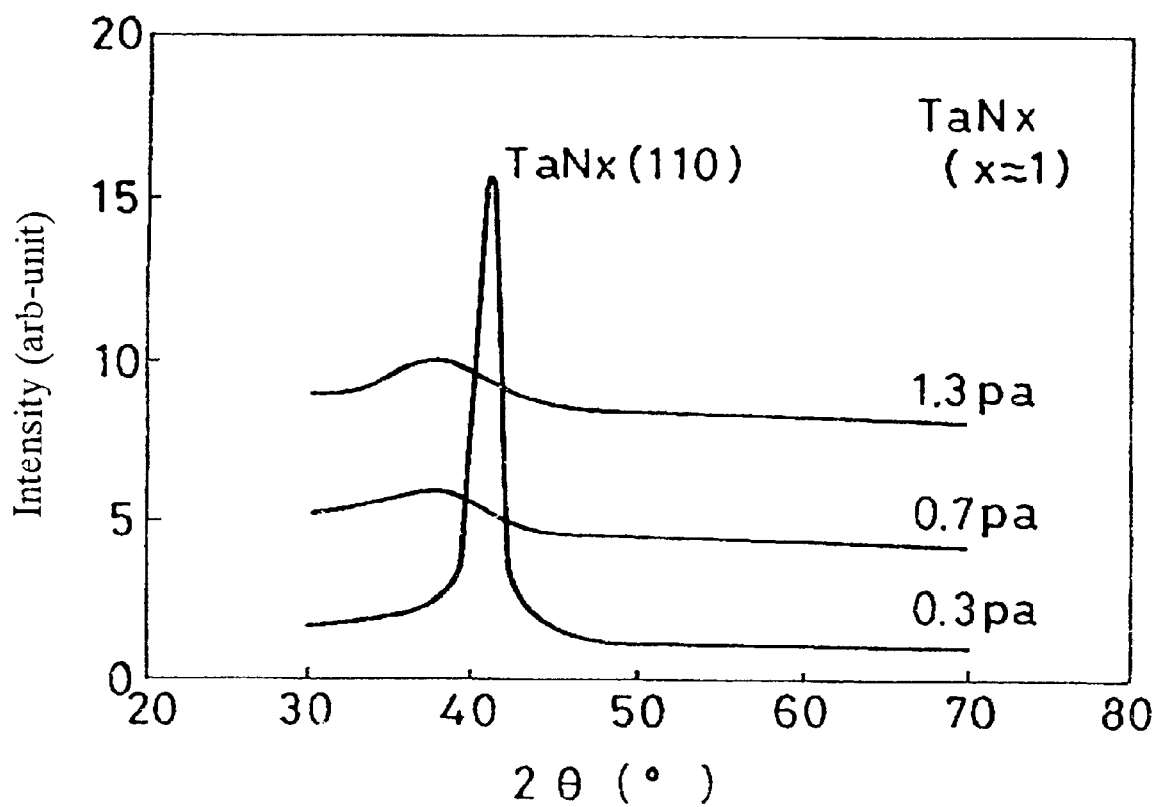
FIG. 6A is a diagram illustrative of X-ray diffraction patterns of a tantalum nitride film over gas pressure during sputtering for growing the tantalum nitride film.

FIG. 6A illustrates results of X-ray deflection for the tantalum nitride films grown under various gas pressures in sputtering for formation of the tantalum nitride film, wherein a Co-K $\alpha$ ray is used.

If the tantalum nitride film is grown by sputtering under the gas pressure at 0.3 pa, then a remarkable (110) peak of hexagonal lattice structure appears at nearly 40 degrees. By contrast, if the tantalum nitride film is grown by sputtering under the gas pressure at 0.7 pa or 1.3 pa, then an unremarkable (110) peak of hexagonal lattice structure appears.

Figure 6B:
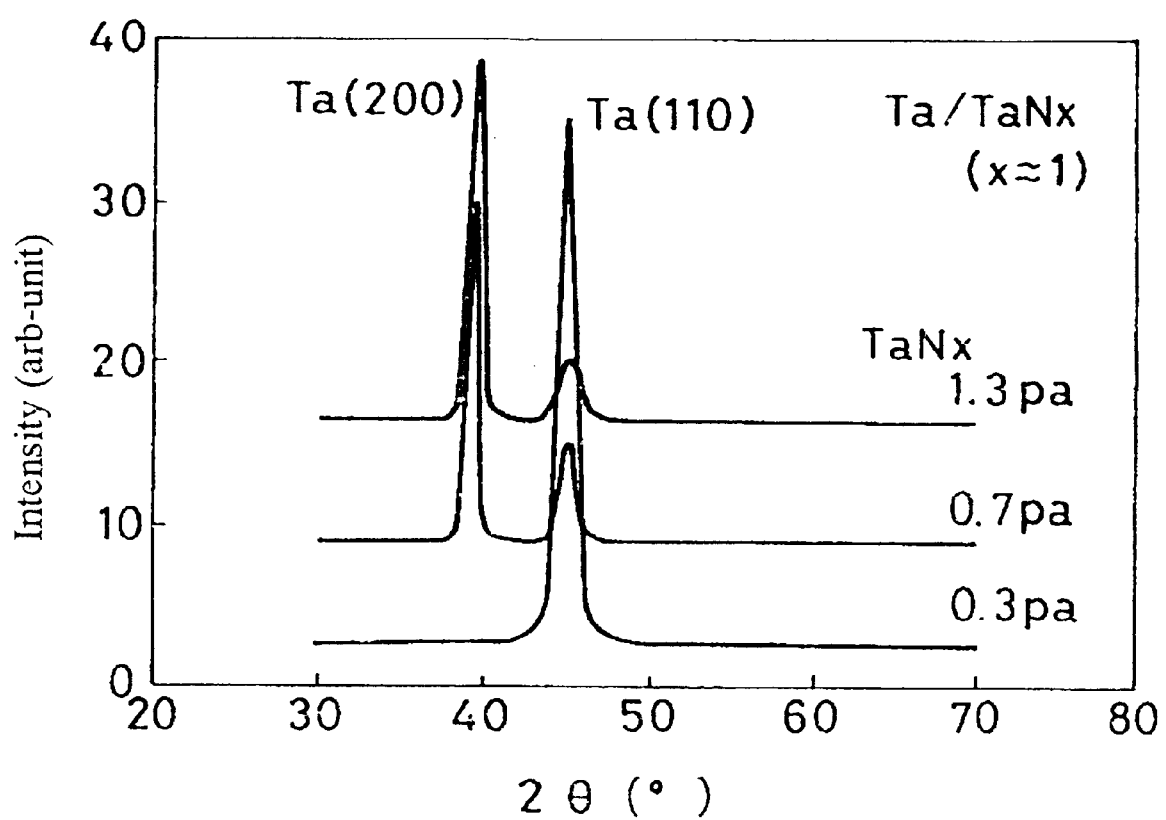
FIG. 6B is a diagram illustrative of X-ray diffraction patterns of laminated tantalum nitride and tantalum films over gas pressure during sputtering for growing the tantalum nitride film.

FIG. 6B illustrates results of X-ray deflection for the tantalum film grown on the tantalum nitride film under various gas pressures in sputtering for formation of the tantalum nitride film underlying the tantalum film, wherein a Co-K $\alpha$ ray is used.

If the tantalum nitride film is grown by sputtering under the gas pressure at 0.3 pa, then a remarkable (110) peak of body centered cubic lattice structure appears at nearly 45 degrees. By contrast, if the tantalum nitride film is grown by sputtering under the gas pressure at 0.7 pa or 1.3 pa, then not only an unremarkable (110) peak of hexagonal lattice structure but also a remarkable (200) peak of tetragonal lattice structure appear at nearly 45 degrees and 40 degrees respectively.

Figure 7A:
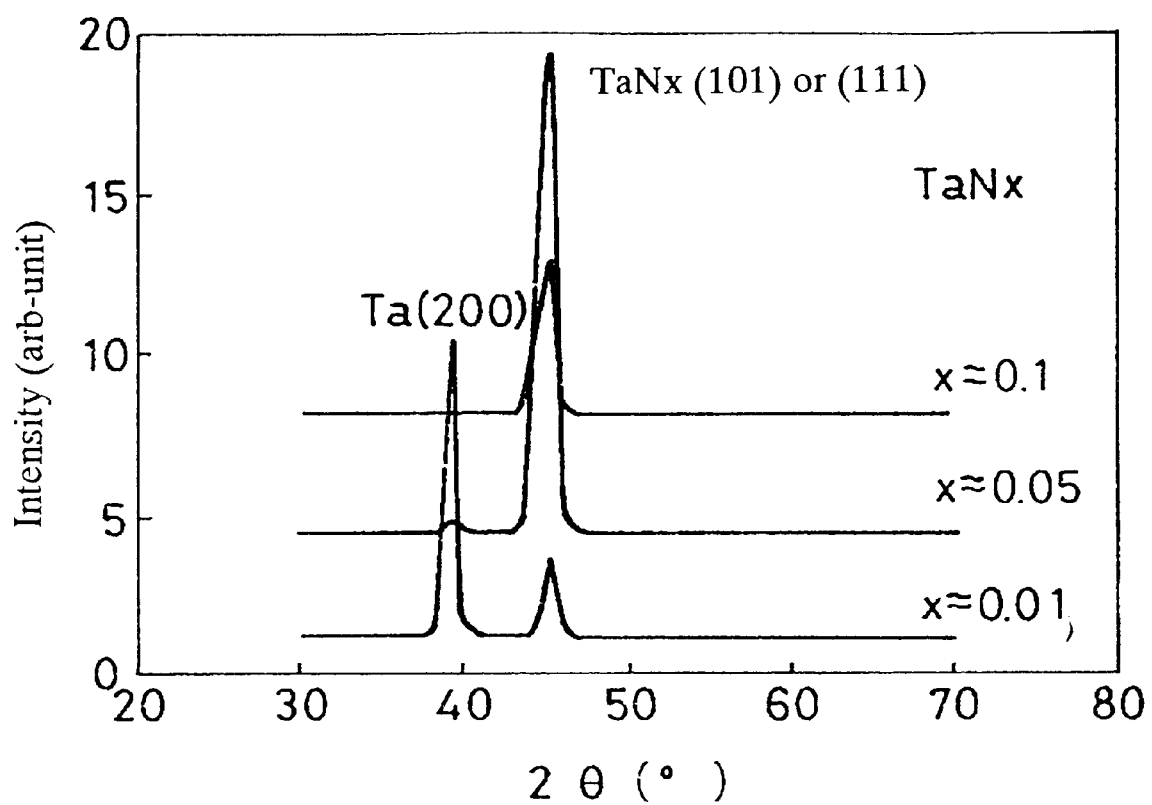
FIG. 7A is a diagram illustrative of X-ray diffraction patterns of a tantalum nitride film over nitrogen content in varying nitrogen gas flow rate during sputtering for growing the tantalum nitride film.

FIG. 7A illustrates results of X-ray deflection for the tantalum nitride films grown over nitrogen concentration and under 0.3 pa of the constant total pressure of argon gas and nitrogen gas in sputtering for formation of the tantalum nitride film, wherein a Co-K $\alpha$ ray is used.

If the nitride concentration is about 1%, then not only an unremarkable (110) peak of hexagonal lattice structure but also a remarkable (200) peak of tetragonal lattice structure appear at nearly 45 degrees and 40 degrees respectively. By contrast, if the nitride concentration is about 5% or 10%, then either a remarkable (101) peak of hexagonal lattice structure or a remarkable (111) peak of hexagonal lattice structure appear at nearly 45 degrees. There is no difference in spacing of lattice planes between the (101) peak and the (111) peak. For this reason, the both peaks appear at the same angle and it is difficult to distinguish the both from each other.

Figure 7B:
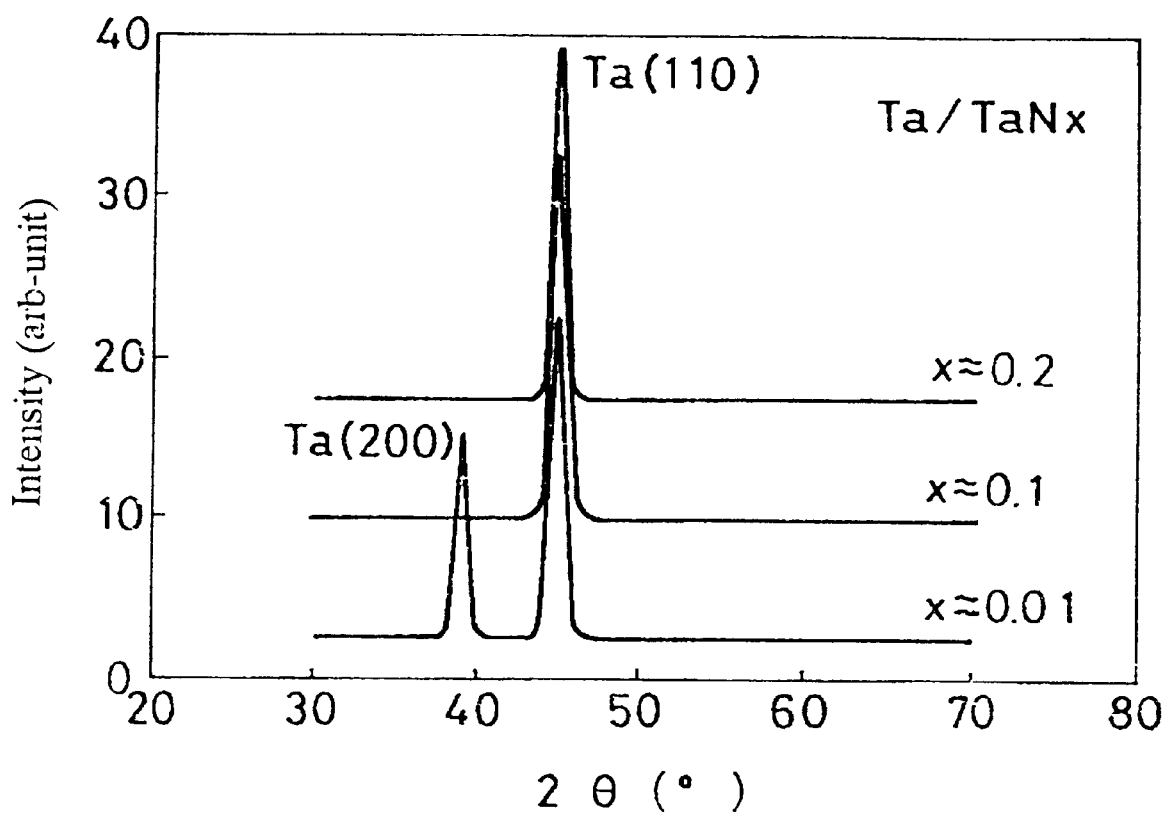
FIG. 7B is a diagram illustrative of X-ray diffraction patterns of lamination tantalum nitride and tantalum films over nitrogen content in varying nitrogen gas flow rate during sputtering for growing the tantalum nitride film.

FIG. 7B illustrates results of X-ray deflection for the tantalum film having a thickness of 3000 angstroms and being laminated over a tantalum nitride film having a thickness of 300 angstroms over various nitrogen concentrations of the tantalum nitride film and under 0.3 pa of the constant total pressure of argon gas and nitrogen gas in sputtering for formation of the tantalum nitride film, wherein a Co-K $\alpha$ ray is used.

If the nitride concentration of the tantalum film is about 1%, then not only a remarkable (110) peak of body centered cubic lattice structure but also a remarkable (200) peak of tetragonal lattice structure appear at nearly 45 degrees and 40 degrees respectively. By contrast, if the nitride concentration of the tantalum nitride film is about 5% or 10%, then only a remarkable (110) peak of body centered cubic lattice structure appears at nearly 45 degrees.

The above experimental results may be considered as follows. From FIG. 6A, it can be understood that decrease in pressure of the process gas used in growth of the tantalum nitride film causes change from amorphous where unremarkable X-ray deflection peak appears into crystalline where remarkable X-ray deflection peak appears.

This means that decrease in pressure of the process gas used in growth of the tantalum nitride film causes a rapid decrease in resistivity of the tantalum nitride film as illustrated in FIG. 5A.

From FIG. 6B, it can be understood that decrease in pressure of the process gas used in growth of the tantalum nitride film to be overlaid by the tantalum film causes change of the tantalum film from the tetragonal lattice structure providing highly resistive phase, for example, $\beta$-phase into the body centered cubic lattice structure lowly resistive phase, for example, $\alpha$-phase. From FIGS. 5A and 6A, it can also be understood that the change of the tantalum film from the tetragonal lattice into the body centered cubic lattice structure is caused by the change of the tantalum nitride film from amorphous into crystalline.

From FIGS. 6A, 6B, 7A, and 7B, it can be understood that in order to obtain a tantalum film having the body centered cubic lattice structure it is required that the tantalum nitride film underlying the tantalum film is oriented in either a (110) plane, a (101) plan and a (111) plane of the hexagonal lattice structure in X-ray deflection.

This fact may be explained as follows. If the tantalum nitride film has the hexagonal lattice structure and the orientation of the hexagonal lattice structure is taken so that the spacing of lattice planes of the hexagonal lattice structure possessed by the tantalum nitride film is near to the spacing of lattice planes in the (110) plane of the body centered cubic lattice structure, whereby the tantalum film having epitaxially been grown on the tantalum nitride film may possess the body centered cubic lattice structure which provides a lowly resistive phase, for example, α-phase.

Tantalum nitride is classified into TaN, TaN$_{0.8}$, Ta$_2$N and Ta$_6$N$_{2.57}$ and further individual crystal structures and lattice planes possessing the spacing of lattice planes which is near to the spacing of lattice planes in (110) plane of the body centered cubic lattice structure possessed by tantalum will be understood from the following Table 1.

TABLE 1

|  | Orientation | 2 θ (CoK α ray) | Spacing Of Lattice Planes |
|---|---|---|---|
| Ta | body centered cubic(110) | 44.99° | 2.338Å |
| TaN | hexagonal(110) | 40.31° | 2.596Å |
| TaN$_{0.8}$ | hexagonal(100) | 41.27° | 2.538Å |
| Ta$_2$N | hexagonal(101) | 45.21° | 2.327Å |
| Ta$_6$N$_{2.57}$ | hexagonal(111) | 45.21° | 2.327Å |

If the tantalum nitride film is formed by a reactive sputtering, then the tantalum nitride film would be any one of TaN$_{0.8}$, Ta$_2$N and Ta$_6$N$_{2.57}$ or in combination.

In FIG. 6A, the tantalum nitride film may be TaN. In FIG. 7A, the tantalum nitride film may be one of Ta$_6$N$_{2.57}$ and Ta$_2$N, or in combination.

The tantalum nitride film (TaNx) underlying the tantalum film has the hexagonal lattice structure. The nitrogen concentration and the orientation in X-ray deflection are selected so that the (110) crystalline exists at x=1, the (100) crystalline exists at x=0.8, then (101) crystalline exists at x=0.5, the (111) crystalline exists at x=0.43, or that a plurality of different crystallines coexist so as to obtain the tantalum film having the body centered cubic lattice structure which provides a low resistivity. By contrast, if the above conditions are not satisfied, then the tantalum film has the tetragonal lattice structure which provides a high resistivity.

If the spacing of lattice planes of the hexagonal lattice structure possessed by the tantalum nitride film is near to the spacing of lattice planes in the (110) plane of the body centered cubic lattice structure, then the tantalum film having epitaxially been grown on the tantalum nitride film may possess the body centered cubic lattice structure which provides a low resistivity phase, for example, α-phase. For those purposes, it is required not only that the thickness and the nitrogen concentration of the tantalum nitride are limited to not less than 300 angstroms and not less than 10 atm %, but also that the reactive sputtering for forming the tantalum nitride film is carried out at a gas pressure of not more than 0.5 pa. As a result, it is possible to obtain a lowly resistive tantalum film having a resistivity in the range of 20 μΩcm to 30 μΩcm.

If the gas pressure in growth of the tantalum nitride film is low, then ionized discharge gas molecules may have a long mean free path, for which reason tantalum nitride molecules having been sputtered are unlikely to receive scattering by ionized gas whereby tantalum nitride molecules are adhered on the substrate at a high energy. Thus, the tantalum nitride molecules having been adhered on the substrate possess high mobility. It is therefore likely to cause atomic rearrangements, resulting in crystallization. By contrast, if the gas pressure is high, then ionized discharge gas molecules may have a short mean free path, for which reason tantalum nitride molecules having been sputtered are likely to receive scattering by ionized gas whereby tantalum nitride molecules are adhered on the substrate at a low energy. Thus, the tantalum nitride molecules having been adhered on the substrate possess ow mobility. It is therefore unlikely to cause atomic rearrangements, resulting in no crystallization.

According to the above described present invention, the tantalum nitride film and the tantalum thin film are sequentially grown on the insulating substrate, wherein a gas pressure in reactive sputtering for growing the tantalum nitride film is limited to a predetermined value not more than about 0.5 pa so that the tantalum nitride film includes a crystalline of hexagonal crystal structure which is structurally stable. The spacing of lattice planes of the crystalline of hexagonal crystal structure of the tantalum nitride film is close to the spacing of lattice planes of a body centered cubic crystal structure, providing a low resistivity, of the tantalum thin film. For example, the spacing of lattice planes of the crystalline of hexagonal crystal structure of the tantalum nitride film is in the range of 2.3 Å to 2.6 Å. Therefore, the tantalum thin film epitaxially grown on the tantalum nitride film has the body centered cubic crystal structure which provides a low resistivity.

The low resistive tantalum nitride/tantalum film laminations according to the present invention may be applicable to switching devices in liquid crystal displays so that a tantalum oxide film may be provided between electrodes, which has a uniform crystalline being almost free of crystal defect. This means that the tantalum oxide film has a high resistivity.

If the above described low resistive tantalum nitride/tantalum film laminations are used as interconnections between electrodes for driving the liquid crystal display, there is almost no difference in transmission time of signals on the interconnections to thereby obtain a uniform and stable display. This leads to an improvement in quality or performance of elements or devices.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A lamination structure of a tantalum nitride film and a nitrogen-free epitaxial tantalum film overlying the tantalum nitride film,
   wherein said tantalum nitride film has a hexagonal crystal structure having a first spacing of lattice planes in the range of 2.3 Å to 2.6 Å; and
   wherein said nitrogen-free epitaxial tantalum film has a body centered cubic crystal structure which forms a hetero-crystal structure interface with said hexagonal crystal structure of said tantalum nitride film, and said body centered cubic crystal structure of said nitrogen-free epitaxial tantalum film has a second spacing of lattice planes within 15% of said first spacing of lattice planes of said hexagonal crystal structure of said tantalum nitride film.

2. The lamination structure as claimed in claim 1, wherein the tantalum nitride film comprises TaN$_x$(x=0.8) and has a crystal orientation of (110) in X-ray diffraction.

3. The lamination structure as claimed in claim 1, wherein the tantalum nitride film comprises TaN$_x$(x=0.8) and has a crystal orientation of (100) in X-ray diffraction.

4. The lamination structure as claimed in claim 1, wherein the tantalum nitride film comprises $TaN_x(x=0.5)$ and has a crystal orientation of (101) in X-ray diffraction.

5. The lamination structure as claimed in claim 1, wherein the tantalum nitride film comprises $TaN_x(x=0.43)$ and has a crystal orientation of (111) in X-ray diffraction.

6. The lamination structure as claimed in claim 1, wherein the tantalum nitride film comprises a mixture having at least two different crystallines selected from the group consisting of a first crystalline which comprises $TaN_x(x=1)$ and has a crystal orientation of (110) in X-ray diffraction, a second crystalline which comprises $TaN_x(x=0.8)$ and has a crystal orientation of (100) in X-ray diffraction, a third crystalline which comprises $TaN_x(x=0.5)$ and has a crystal orientation of (101) in X-ray diffraction, and a fourth crystalline which comprises $TaN_x(x=0.43)$ and has a crystal orientation of (111) in X-ray diffraction.

7. The lamination structure as claimed in claim 1, wherein said nitrogen-free epitaxial tantalum film has a resistivity in the range of 20–30 $\mu\Omega$cm.

* * * * *